United States Patent
Nanashima et al.

(10) Patent No.: US 10,920,117 B2
(45) Date of Patent: Feb. 16, 2021

(54) CURABLE COMPOSITION, METHOD FOR PRODUCING CURABLE COMPOSITION, CURED PRODUCT, USE OF CURABLE COMPOSITION, AND OPTICAL DEVICE

(71) Applicant: LINTEC CORPORATION, Tokyo (JP)

(72) Inventors: Yutaka Nanashima, Tokyo (JP); Hidekazu Nakayama, Tokyo (JP); Manabu Miyawaki, Tokyo (JP); Mikihiro Kashio, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 30 days.

(21) Appl. No.: 15/780,537

(22) PCT Filed: Dec. 21, 2016

(86) PCT No.: PCT/JP2016/088246
§ 371 (c)(1),
(2) Date: May 31, 2018

(87) PCT Pub. No.: WO2017/110948
PCT Pub. Date: Jun. 29, 2017

(65) Prior Publication Data
US 2018/0355111 A1 Dec. 13, 2018

(30) Foreign Application Priority Data
Dec. 22, 2015 (JP) .................. 2015-250314

(51) Int. Cl.
| | | |
|---|---|---|
| C09J 183/08 | (2006.01) | |
| C08G 77/24 | (2006.01) | |
| C08K 5/544 | (2006.01) | |
| C08L 83/08 | (2006.01) | |
| C08K 5/541 | (2006.01) | |
| C08L 83/04 | (2006.01) | |
| C08G 77/06 | (2006.01) | |
| C09K 3/10 | (2006.01) | |
| C08G 77/18 | (2006.01) | |
| C08K 5/00 | (2006.01) | |
| H01L 23/29 | (2006.01) | |
| C08G 77/00 | (2006.01) | |

(52) U.S. Cl.
CPC ............ *C09J 183/08* (2013.01); *C08G 77/06* (2013.01); *C08G 77/24* (2013.01); *C08K 5/541* (2013.01); *C08K 5/544* (2013.01); *C08L 83/04* (2013.01); *C08L 83/08* (2013.01); *C09K 3/1018* (2013.01); *C08G 77/18* (2013.01); *C08G 77/70* (2013.01); *C08G 2170/00* (2013.01); *C08K 5/0025* (2013.01); *H01L 23/296* (2013.01)

(58) Field of Classification Search
CPC ...................................... C08G 77/24
USPC .............................................. 528/42
See application file for complete search history.

(56) References Cited

U.S. PATENT DOCUMENTS

| | | | | |
|---|---|---|---|---|
| 9,469,763 | B2 * | 10/2016 | Yoo ......................... | C09J 4/00 |
| 2009/0008673 | A1 | 1/2009 | Kato et al. | |
| 2013/0210982 | A1* | 8/2013 | Tien ....................... | C08L 83/04 |
| | | | | 524/264 |
| 2015/0065663 | A1 | 3/2015 | Matsui et al. | |
| 2020/0066946 | A1* | 2/2020 | Shimizu ................ | H01L 21/31 |

FOREIGN PATENT DOCUMENTS

| | | | |
|---|---|---|---|
| JP | 04360891 A | * | 12/1992 |
| JP | 2002-9232 A | | 1/2002 |
| JP | 2004-359933 A | | 12/2004 |
| JP | 2005-263869 A | | 9/2005 |
| JP | 2006-219570 A | | 8/2006 |
| JP | 2006-285017 A | | 10/2006 |
| JP | 2006-328231 A | | 12/2006 |
| JP | 2007-112975 A | | 5/2007 |
| JP | 2014-152246 A | | 8/2014 |
| WO | WO 2013/141360 A1 | | 9/2013 |

OTHER PUBLICATIONS

Machine translation of JP 04-360891 (no date).*
International Search Report for PCT/JP2016/088246 (PCT/ISA/210) dated Feb. 21, 2017.

* cited by examiner

*Primary Examiner* — Marc S Zimmer
(74) *Attorney, Agent, or Firm* — Birch, Stewart, Kolasch & Birch, LLP

(57) ABSTRACT

The invention is a curable composition comprising the following component (A) and component (B):
Component (A): a curable polysilsesquioxane compound having a repeating unit represented by the following specific formula (a-1):

$$R^1—D—SiO_{3/2} \qquad (a-1)$$

Component (B): a silane coupling agent having a nitrogen atom in its molecule, and
a method for producing the curable composition, and
a cured product obtained by curing the curable composition, and
a method for using the curable composition as an adhesive for an optical element-fixing material, and
a method for using the curable composition as a sealant for an optical element-fixing material, and
an optical device obtained by using the curable composition as an adhesive or a sealant for an optical element-fixing material.
One aspect of the curable composition according to one embodiment of the invention can provide a cured product excellent in adhesiveness and heat resistance and having a low refractive index.

14 Claims, No Drawings

CURABLE COMPOSITION, METHOD FOR PRODUCING CURABLE COMPOSITION, CURED PRODUCT, USE OF CURABLE COMPOSITION, AND OPTICAL DEVICE

TECHNICAL FIELD

The present invention relates to a curable composition which provides a cured product excellent in adhesiveness and heat resistance and having a low refractive index, a method for producing the curable composition, a cured product obtained by curing the curable composition, a method for using the curable composition as an adhesive or sealant for an optical element-fixing material, and an optical device.

BACKGROUND ART

Conventionally, curable compositions have been variously improved depending on the application, and have been widely used industrially as raw materials for optical components and formed articles, adhesives, coating agents, and the like.

In addition, the curable composition has also attracted attention as a composition for an optical element-fixing material, such as an adhesive and sealant for an optical element in producing an optical element sealant.

The optical elements are exemplified by a light emitter including various lasers such as a semiconductor laser (LD) and a light emitting diode (LED), a light-receiving element, a composite optical element, an optical integrated circuit, and the like.

In recent years, optical elements of blue light or white light having a shorter emission peak wavelength have been developed and widely used. Luminance of such a light emitter having a short emission peak wavelength has been dramatically enhanced, and accordingly, there has been tendency for a calorific value of the optical element to increase.

However, accompanying the increased luminance of the optical element in recent years, problems have occurred that a cured product of the composition for the optical element-fixing material is exposed to heat at higher temperature caused by light or an optical element with higher energy for a long time, resulting in reduced adhesive strength.

In order to solve this problem, Patent Documents 1 to 3 propose compositions for optical element-fixing materials containing a polysilsesquioxane compound as a main component, and Patent Document 4 proposes a component for a semiconductor light-emitting device using a hydrolyzate/polycondensate of a silane compound, and the like.

However, even by the cured products of the compositions described in Patent Documents 1 to 4, it was difficult to obtain heat resistance while maintaining sufficient adhesive strength in some cases.

In addition, when an optical element or the like is fixed using a curable composition, forming a cured product is often important having a refractive index matched to the purpose. In particular, since many cured products of conventional curable compositions had high refractive indexes, a curable composition to provide a cured product with a lower refractive index has been strongly desired.

CITATION LIST

Patent Literature

Patent Literature 1: JP-A-2004-359933
Patent Literature 2: JP-A-2005-263869
Patent Literature 3: JP-A-2006-328231
Patent Literature 4: JP-A-2007-112975 (US 2009/0008673 A1)
Patent Literature 5: JP-A-2002-009232

SUMMARY OF INVENTION

Technical Problem

The present invention has been made in view of the above-described circumstances of the prior art, and the object of the invention is to provide a curable composition which provides a cured product excellent in adhesiveness and heat resistance and having a low refractive index, a method for producing the curable composition, a cured product obtained by curing the curable composition, a method for using the curable composition as an adhesive or sealant for an optical element-fixing material, and an optical device.

Solution to Problem

The present inventors repeated intensive studies to solve the above problems. As a result, the inventors have found that a curable composition containing a particular curable polysilsesquioxane compound and a silane coupling agent having a nitrogen atom in its molecule provides a cured product excellent in adhesiveness and heat resistance and having a low refractive index, and this finding has led to the completion of the invention.

Thus, one aspect of the invention provides curable compositions of the following [1] to [9], a method for producing the curable composition of [10], cured products of [11] and [12], methods for using the curable composition of [13] and [14], and an optical device of [15].

[1] A curable composition containing the following component (A) and component (B).

Component (A): a curable polysilsesquioxane compound having a repeating unit represented by the following formula (a-1):

$$R^1\text{—D—SiO}_{3/2} \qquad (a\text{-}1)$$

[wherein, $R^1$ represents a fluoroalkyl group represented by a compositional formula: $C_xH_{(2x-y+1)}F_y$. x represents an integer of 1 to 10, and y represents an integer of 2 to (2x+1). D represents a linking group (excluding an alkylene group) for connecting $R^1$ and Si, or a single bond.]

Component (B): a silane coupling agent having a nitrogen atom in its molecule

[2] The curable composition according to [1], wherein the curable polysilsesquioxane compound of the component (A) further has a repeating unit represented by the following formula (a-2).

$$R^2\text{SiO}_{3/2} \qquad (a\text{-}2)$$

(wherein $R^2$ represents an unsubstituted alkyl group having 1 to 10 carbon atoms, or an aryl group having 6 to 12 carbon atoms with or without substituents.)

[3] The curable composition according to [2], wherein $R^2$ is an unsubstituted alkyl group having 1 to 10 carbon atoms in the repeating unit represented by the (a-2).

[4] The curable composition according to [2] or [3], wherein the component (A) contains the repeating unit represented by the (a-1) and the repeating unit represented by the (a-2) in a molar ratio [repeating unit represented by (a-1)]:[repeating unit represented by (a-2)] of 5:95 to 100:0.

[5] The curable composition according to any one of [1] to [4], wherein the curable polysilsesquioxane compound of the component (A) has a mass-average molecular weight (Mw) of 800 to 20,000.

[6] The curable composition according to any one of [1] to [5], wherein the component (A) is obtained by polycondensing a compound represented by the following formula (a-3), or compounds represented by the following formulas (a-3) and (a-4) in the presence of a polycondensation catalyst.

$$R^1\text{—}D\text{—}Si(OR^3)_p(X^1)_{3-p} \quad (a\text{-}3)$$

$$R^2Si(OR^4)_q(X^2)_{3-q} \quad (a\text{-}4)$$

(wherein $R^1$, $R^2$ and D represent the same as described in [2]. Each of $R^3$ and $R^4$ independently represents an alkyl group having 1 to 10 carbon atoms, each of $X^1$ and $X^2$ independently represents a halogen atom, each of p and q independently represents an integer of 0 to 3. Each of the plural $R^3$, $R^4$, $X^1$ and $X^2$ may be the same or different from each other.)

[7] The curable composition according to any one of [1] to [6], further containing a diluent.

[8] The curable composition according to [7], wherein the total amount of the component (A) and the component (B) is 50 to 100 mass % based on the whole components excluding the diluent in the curable composition.

[9] The curable composition according to any one of [1] to [8], wherein the solid content of the curable composition is 50 mass % to less than 100 mass %.

[10] A method for producing the curable composition according to any one of [1] to [9], having the following steps (I) and (II):

Step (I): the step of obtaining the curable polysilsesquioxane compound by polycondensing the compound represented by the following foiniula (a-3), or the compounds represented by the following formulas (a-3) and (a-4) in the present of the polycondensation catalyst:

$$R^1\text{—}D\text{—}Si(OR^3)_p(X^1)_{3-p} \quad (a\text{-}3)$$

$$R^2Si(OR^4)_q(X^2)_{3-q} \quad (a\text{-}4)$$

(wherein $R^1$, $R^2$ and D represent the same as described above. Each of $R^3$ and $R^4$ independently represents an alkyl group having 1 to 10 carbon atoms, each of $X^1$ and $X^2$ independently represents a halogen atom, each of p and q independently represents an integer of 0 to 3. Each of the plural $R^3$, $R^4$, $X^1$ and $X^2$ may be the same or different from each other.).

Step (II): the step of mixing the curable polysilsesquioxane compound obtained in the step (I) with the component (B).

[11] A cured product obtained by curing the curable composition according to any one of [1] to [9].

[12] The cured product according to [11], which is an optical element-fixing material.

[13] A method for using the curable composition according to any one of [1] to [9] as an adhesive for an optical element-fixing material.

[14] A method for using the curable composition according to any one of [1] to [9] as a sealant for an optical element-fixing material.

[15] An optical device obtained by using the curable composition according to any one of [1] to [9] as an adhesive or a sealant for an optical element-fixing material.

Advantageous Effects of Invention

One aspect of the curable composition according to one embodiment of the invention can provide a cured product excellent in adhesiveness and heat resistance and having a low refractive index.

The curable composition according to one embodiment of the invention can be suitably used as an adhesive and sealant for an optical element-fixing material.

DESCRIPTION OF EMBODIMENTS

Hereinafter, the embodiments of the present invention will be classified into 1) a curable composition and the production method thereof, 2) a cured product, 3) a method for using the curable composition and 4) an optical device, and described in detail.

1) Curable Composition

The curable composition according to one embodiment of the invention contains the following components (A) and (B).

Component (A): curable polysilsesquioxane compound having a repeating unit represented by the following formula (a-1):

$$R^1\text{—}D\text{—}SiO_{3/2} \quad (a\text{-}1)$$

[wherein, $R^1$ represents a fluoroalkyl group represented by a compositional formula: $C_xH_{(2x-y+1)}F_y$. x represents an integer of 1 to 10, and y represents an integer of 2 to (2x+1). D represents a linking group (excluding an alkylene group) for connecting $R^1$ and Si or a single bond.]

Component (B): a silane coupling agent having a nitrogen atom in its molecule

Component (A)

The component (A) constituting the curable composition according to one embodiment of the invention is a curable polysilsesquioxane compound having the repeating unit represented by the formula (a-1) (hereinafter referred to as "silane compound polymer (A)" in some cases).

In the formula (a-1), $R^1$ represents a fluoroalkyl group represented by the compositional formula: $C_xH_{(2x-y+1)}F_y$. x represents an integer of 1 to 10, and y represents an integer of 2 to (2x+1). x represents an integer of preferably 1 to 5, and more preferably 1 to 3.

Since the curable composition according to one embodiment of the invention contains the curable polysilsesquioxane compound having $R^1$, it provides a cured product which exhibits a low refractive index when cured.

Examples of the fluoroalkyl group represented by the compositional formula: $C_xH_{(2x-y+1)}F_y$ include a perfluoroalkyl group such as $CF_3$—, $CF_3CF_2$—, $CF_3(CF_2)_2$—, $CF_3(CF_2)_3$—, $CF_3(CF_2)_4$—, $CF_3(CF_2)_5$—, $CF_3(CF_2)_6$—, $CF_3(CF_2)_7$—, $CF_3(CF_2)_8$— and $CF_3(CF_2)_9$—; and a hydrofluoroalkyl group such as $CF_3CH_2CH_2$—, $CF_3(CF_2)_3CH_2CH_2$—, $CF_3(CF_2)_5CH_2CH_2$— and $CF_3(CF_2)_7CH_2CH_2$—.

D represents a linking group (excluding an alkylene group) for connecting $R^1$ and Si or a single bond.

Examples of the linking group of D include an arylene group such as a 1,4-phenylene group, a 1,3-phenylene group, a 1,2-phenylene group and a 1,5-naphthylene group.

The repeating unit represented by the formula (a-1) is represented by the following formula. In the present specification, $O_{1/2}$ indicates that an oxygen atom is shared with an adjacent repeating unit.

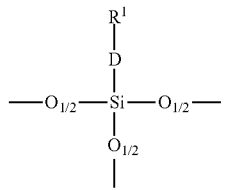

Thus, the silane compound polymer (A) generally has a partial structure generally called a T-site in which three oxygen atoms bind to a silicon atom and another group ($R^1$—D—) binds to the silicon atom Specific examples of the T site include those represented by the following formulas (a-5) to (a-7).

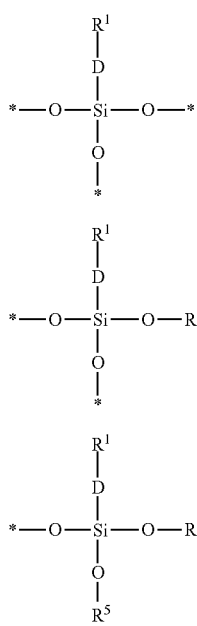

In formulas (a-5), (a-6) and (a-7), $R^1$ and D represent the same as described above. $R^5$ represents a hydrogen atom or an alkyl group having 1 to 10 carbon atoms. Examples of the alkyl group having 1 to 10 carbon atoms represented by $R^5$ include a methyl group, an ethyl group, an n-propyl group, an isopropyl group, an n-butyl group, an s-butyl group, an isobutyl group, a t-butyl group and the like. The plural $R^5$ may be all the same or different from each other. Additionally, in the above formulas (a-5) to (a-7), * is bound to Si atom.

The silane compound polymer (A) is soluble in various organic solvents such as: a ketone-based solvent such as acetone; an aromatic hydrocarbon-based solvent such as benzene; a sulfur-containing solvent such as dimethylsulfoxide; an ether-based solvent such as tetrahydrofuran; an ester-based solvent such as ethyl acetate; a halogen-containing solvent such as chloroform; and a mixed solvent including two or more kinds of them; and therefore $^{29}$Si-NMR of the silane compound polymer (A) in a solution state can be measured using these solvents.

As a result of measuring the $^{29}$Si-NMR of the silane compound polymer (A) in the solution state, a peak (T3) attributed to a silicon atom in the structure represented by the formula (a-5), a peak (T2) attributed to a silicon atom in the structure represented by the formula (a-6) and a peak (T1) attributed to a silicon atom in the structure represented by the formula (a-7) are normally observed at different regions respectively.

The silane compound polymer (A) has an integrated value of T3 of preferably 60 to 90% based on the total the integrated values of T1, T2 and T3.

The silane compound polymer (A) may be a polymer having one type of ($R^1$—D) (homopolymer) or a polymer having two or more types of ($R^1$—D) (copolymer).

In addition, the silane compound polymer (A) may be a polymer having a repeating unit represented by the following formula (a-2) (copolymer).

The repeating unit represented by formula (a-2) is represented by the following formula.

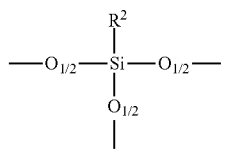

In the formula (a-2), $R^2$ represents an unsubstituted alkyl group having 1 to 10 carbon atoms, or an aryl group having 6 to 12 carbon atoms with or without substituents.

Examples of the unsubstituted alkyl group having 1 to 10 carbon atoms represented by $R^2$ include a methyl group, an ethyl group, an n-propyl group, an isopropyl group, an n-butyl group, an isobutyl group, an s-butyl group, a t-butyl group, an n-pentyl group, an n-hexyl group, an n-octyl group, an n-nonyl group, an n-decyl group and the like.

Examples of the unsubstituted aryl group having 6 to 12 carbon atoms represented by $R^2$ include a phenyl group, a 1-naphthyl group, a 2-naphthyl group and the like.

Examples of the substituent in the aryl group having substituents and 6 to 12 carbon atoms represented by $R^2$ include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group and an isooctyl group; a halogen atom such as a fluorine atom, a chlorine atom and a bromine atom; and an alkoxy group such as a methoxy group and an ethoxy group.

Above all, $R^2$ is preferably an unsubstituted alkyl group having 1 to 10 carbon atoms, more preferably 1 to 6 carbon atoms, and particularly preferably 1 to 3 carbon atoms because a curable composition capable of providing a cured product more excellent in adhesiveness and heat resistance can be easily obtained.

A molar ratio between the repeating unit represented by the (a-1) and the repeating unit represented by the (a-2) [repeating unit represented by (a-1)]:[repeating unit represented by (a-2)] in the silane compound polymer (A) can be adjusted depending on the desired refractive index.

From the viewpoint of maintaining the adhesive strength, it is preferably 5:95 to 100:0, more preferably 10:90 to 45:55, and particularly preferably 20:80 to 35:65.

From the viewpoint of maintaining the low refractive index, it is preferably 5:95 to 100:0, more preferably 40:60 to 90:10, and particularly preferably 55:45 to 80:20.

The ratios of the repeating units represented by the formula (a-1) and the formula (a-2) in the silane compound polymer (A) can be determined e.g. by measuring $^{29}$Si-NMR of the silane compound polymer (A).

When the silane compound polymer (A) is a copolymer, the silane compound polymer (A) may be any of a random copolymer, a block copolymer, a graft copolymer, an alternating copolymer and the like, but, from the viewpoint of ease of production and the like, the random copolymer is preferred.

In addition, the structure of the silane compound polymer (A) may be any of a ladder-type structure, a double deckertype structure, a cage-type structure, a partial cleavage cage-type structure, a ring-type structure and a random-type structure.

The mass-average molecular weight (Mw) of the silane compound polymer (A) is normally within a range of 800 to 20,000, preferably 1,200 to 15,000, more preferably 2,000 to 10,000, even more preferably 3,000 to 8,000, and particularly preferably 4,000 to 7,000. When a polymerizable composition containing the silane compound polymer (A) having a mass-average molecular weight (Mw) within the above range is used, a cured product excellent in adhesiveness and heat resistance can be easily obtained.

The molecular weight distribution (Mw/Mn) of the silane compound polymer (A) is not particularly limited but is normally within a range of 1.0 to 10.0, and preferably 1.1 to 6.0. When the polymerizable composition containing the silane compound polymer (A) having the molecular weight distribution (Mw/Mn) within the above range is used, a cured product excellent in adhesiveness and heat resistance can be easily obtained.

The mass-average molecular weight (Mw) and the number average molecular weight (Mn) can be determined as e.g. standard polystyrene-equivalent values by gel permeation chromatography (GPC) using tetrahydrofuran (THF) as a solvent.

In the present invention, the silane compound polymer (A) may be used either alone or in combination of two or more kinds.

The method for producing the silane compound polymer (A) is not particularly limited. For example, the silane compound polymer (A) can be produced by polycondensing a compound represented by the following formula (a-3) (hereinafter referred to as "silane compound (1)" in some cases) or compounds represented by the following formulas (a-3) and (a-4) (hereinafter referred to as "silane compound (2)" in some cases) in the presence of a polycondensation catalyst.

$$R^1\text{—}D\text{—}Si(OR^3)_p(X^1)_{3-p} \quad (a\text{-}3)$$

$$R^2Si(OR^4)_q(X^2)_{3-q} \quad (a\text{-}4)$$

In formulas (a-3) and (a-4), $R^1$, $R^2$ and D represent the same groups as described above. Each of $R^3$ and $R^4$ independently represents an alkyl group having 1 to 10 carbon atoms, each of $X^1$ and $X^2$ independently represents a halogen atom, each of p and q independently represents an integer of 0 to 3. Each of the plural $R^3$, $R^4$, $X^1$ and $X^2$ may be the same or different from each other.

Examples of the alkyl groups having 1 to 10 carbon atoms represented by $R^3$ and $R^4$ include the same as shown for the alkyl group having 1 to 10 carbon atoms represented by $R^2$.

Examples of the halogen atoms represented by $X^1$ and $X^2$ include a chlorine atom, a bromine atom and the like.

Examples of the silane compound (1) include: fluoroalkyltrialkoxysilane compounds such as $CF_3Si(OCH_3)_3$, $CF_3CF_2Si(OCH_3)_3$, $CF_3CF_2CF_2Si(OCH_3)_3$, $CF_3CF_2CF_2CF_2Si(OCH_3)_3$, $CF_3CH_2CH_2Si(OCH_3)_3$, $CF_3CF_2CF_2CF_2CH_2CH_2Si(OCH_3)_3$, $CF_3CF_2CF_2CF_2CF_2CF_2CH_2CH_2Si(OCH_3)_3$, $CF_3CF_2CF_2CF_2CF_2CF_2CF_2CF_2CH_2CH_2Si(OCH_3)_3$, $CF_3(C_6H_4)Si(OCH_3)_3$(4-(trifluoromethyl)phenyltrimethoxysilane), $CF_3Si(OCH_2CH_3)_3$, $CF_3CF_2Si(OCH_2CH_3)_3$, $CF_3CF_2CF_2Si(OCH_2CH_3)_3$, $CF_3CF_2CF_2CF_2Si(OCH_2CH_3)_3$, $CF_3CH_2CH_2Si(OCH_2CH_3)_3$, $CF_3CF_2CF_2CF_2CH_2CH_2Si(OCH_2CH_3)_3$, $CF_3CF_2CF_2CF_2CF_2CF_2CH_2CH_2Si(OCH_2CH_3)_3$, $CF_3CF_2CF_2CF_2CF_2CF_2CF_2CF_2CH_2CH_2Si(OCH_2CH_3)_3$, $CF_3(C_6H_4)Si(OCH_2CH_3)_3$, 4-(trifluoromethyl)phenyltriethoxysilane; fluoroalkyl halogenodialkoxysilane compounds such as $CF_3SiCl(OCH_3)_2$, $CF_3CF_2SiCl(OCH_3)_2$, $CF_3CF_2CF_2SiCl(OCH_3)_2$, $CF_3SiBr(OCH_3)_2$, $CF_3CF_2SiBr(OCH_3)_2$, $CF_3CF_2CF_2SiBr(OCH_3)_2$, $CF_3CF_2CF_2CF_2SiCl(OCH_3)_2$, $CF_3CH_2CH_2SiCl(OCH_3)_2$, $CF_3CF_2CF_2CF_2CH_2CH_2SiCl(OCH_3)_2$, $CF_3CF_2CF_2CF_2CF_2CF_2CH_2CH_2SiCl(OCH_3)_2$, $CF_3CF_2CF_2CF_2CF_2CF_2CF_2CF_2CH_2CH_2SiCl(OCH_3)_2$, $CF_3(C_6H_4)SiCl(OCH_3)_2$, 4-(trifluoromethyl)phenylchlorodimethoxysilane, $CF_3SiCl(OCH_2CH_3)_2$, $CF_3CF_2SiCl(OCH_2CH_3)_2$, $CF_3CF_2CF_2SiCl(OCH_2CH_3)_2$, $CF_3CF_2CF_2CF_2SiCl(OCH_2CH_3)_2$, $CF_3CH_2CH_2SiCl(OCH_2CH_3)_2$, $CF_3CF_2CF_2CF_2CH_2CH_2SiCl(OCH_2CH_3)_2$, $CF_3CF_2CF_2CF_2CF_2CF_2CH_2CH_2SiCl(OCH_2CH_3)_2$, $CF_3CF_2CF_2CF_2CF_2CF_2CF_2CF_2CH_2CH_2SiCl(OCH_2CH_3)_2$, $CF_3(C_6H_4)SiCl(OCH_2CH_3)_2$ and 4-(trifluoromethyl)phenylchlorodiethoxysilane; fluoroalkyl dihalogenoalkoxysilane compounds such as $CF_3SiCl_2(OCH_3)$, $CF_3CF_2SiCl_2(OCH_3)$, $CF_3CF_2CF_2SiCl_2(OCH_3)$, $CF_3CF_2CF_2CF_2SiCl_2(OCH_3)$, $CF_3CH_2CH_2SiCl_2(OCH_3)$, $CF_3CF_2CF_2CF_2CH_2CH_2SiCl_2(OCH_3)$, $CF_3CF_2CF_2CF_2CF_2CF_2CH_2CH_2SiCl_2(OCH_3)$, $CF_3CF_2CF_2CF_2CF_2CF_2CF_2CF_2CH_2CH_2SiCl_2(OCH_3)$, $CF_3(C_6H_4)SiCl_2(OCH_3)$, 4-(trifluoromethyl)phenyldichloromethoxysilane, $CF_3SiCl_2(OCH_2CH_3)$, $CF_3CF_2SiCl_2(OCH_2CH_3)$, $CF_3CF_2CF_2SiCl_2(OCH_2CH_3)$, $CF_3CF_2CF_2CF_2SiCl_2(OCH_2CH_3)$, $CF_3CH_2CH_2SiCl_2(OCH_2CH_3)$, $CF_3CF_2CF_2CF_2CH_2CH_2SiCl_2(OCH_2CH_3)$, $CF_3CF_2CF_2CF_2CF_2CF_2CH_2CH_2SiCl_2(OCH_2CH_3)$, $CF_3CF_2CF_2CF_2CF_2CF_2CF_2CF_2CH_2CH_2SiCl_2(OCH_2CH_3)$, $CF_3(C_6H_4)SiCl_2(OCH_2CH_3)$ and 4-(trifluoromethyl)phenyldichloroethoxysilane; and fluoroalkyltrihalogenosilane compounds such as $CF_3SiCl_3$, $CF_3CF_2SiCl_3$, $CF_3SiBr_3$, $CF_3CF_2SiBr_3$, $CF_3CF_2CF_2SiCl_3$, $CF_3CF_2CF_2CF_2SiCl_3$, $CF_3CH_2CH_2SiCl_3$, $CF_3CF_2CF_2CF_2CH_2CH_2SiCl_3$, $CF_3CF_2CF_2CF_2CF_2CF_2CH_2CH_2SiCl_3$, $CF_3CF_2CF_2CF_2CF_2CF_2CF_2CF_2CH_2CH_2SiCl_3$, $CF_3(C_6H_4)SiCl_3$, 4-trifluoromethylphenyltrichlorosilane, $CF_3SiCl_3$, $CF_3CF_2SiCl_3$, $CF_3CF_2SiCl_3$, $CF_3CF_2CF_2SiCl_3$, $CF_3CH_2CH_2SiCl_3$, $CF_3CF_2CF_2CF_2CH_2CH_2SiCl_3$, $CF_3CF_2CF_2CF_2CF_2CF_2CH_2CH_2SiCl_3$, $CF_3CF_2CF_2CF_2CF_2CF_2CF_2CF_2CH_2CH_2SiCl_3$, $CF_3(C_6H_4)SiCl_3$ and 4-(trifluoromethyl)phenyltrichlorosilane.

The silane compound (1) may be used either alone or in combination of two or more kinds.

Above all, the fluoroalkyltrialkoxysilane compounds are preferred as the silane compound (1).

Examples of the silane compound (2) include alkyltrialkoxysilane compounds such as methyltrimethoxysilane, methyltriethoxysilane, ethyltrimethoxysilane, ethyltriethoxysilane, ethyltripropoxysilane, n-propyltrimethoxysilane, n-propyltriethoxysilane, n-propyltripropoxysilane, n-propyltributoxysilane, n-butyltrimethoxysilane, isobutyltrimethoxysilane, n-pentyltrimethoxysilane, n-hexyltrimethoxysilane and isooctyltriethoxysilane;

alkylhalogenoalkoxysilane compounds such as methylchlorodimethoxysilane, methylchlorodiethoxysilane, methyldichloromethoxysilane, methylbromodimethoxysilane, ethylchlorodimethoxysilane, ethylchlorodiethoxysilane, ethyldichloromethoxysilane, ethylbromodimethoxysilane, n-propylchlorodimethoxysilane, n-propyldichloromethoxysilane, n-butylchlorodimethoxysilane and n-butyldichloromethoxysilane;

alkyltrihalogenosilane compounds such as methyltrichlorosilane, methyltribromosilane, ethyltrichlorosilane, ethyltribromosilane, n-propyltrichlorosilane, n-propyltribromosilane, n-butyltrichlorosilane, isobutyltrichlorosilane, n-pentyltrichlorosilane, n-hexyltrichlorosilane and isooctyltrichlorosilane; and the like.

The silane compound (2) may be used either alone or in combination of two or more kinds.

Above all, alkyltrialkoxysilane compounds are preferred as the silane compound (2).

The method for polycondensing the silane compound is not particularly limited. The method is exemplified by a method in which a predetermined amount of a polycondensation catalyst is added to the silane compound with or without a solvent and stirred at a predetermined temperature, for example. More specific examples thereof include (a) a method in which a predetermined amount of an acid catalyst is added to the silane compound and stirred at a predetermined temperature, (b) a method in which a predetermined amount of a base catalyst is added to the silane compound and stirred at a predetermined temperature, (c) a method in which a predetermined amount of an acid catalyst is added to the silane compound, stirred at a predetermined temperature, to which subsequently an excess amount of a base catalyst is added to make the reaction system basic, and stirred at a predetermined temperature, and the like. Above all, the method (a) or (c) is preferred because the desired silane compound polymer (A) can be efficiently obtained.

The polycondensation catalyst for use may be any of an acid catalyst and a base catalyst. In addition, two or more polycondensation catalysts may be used in combination, but it is preferable to use at least an acid catalyst.

Examples of the acid catalyst include an inorganic acid such as phosphoric acid, hydrochloric acid, boric acid, sulfuric acid and nitric acid; an organic acid such as citric acid, acetic acid, methanesulfonic acid, trifluoromethanesulfonic acid, benzenesulfonic acid and p-toluenesulfonic acid; and the like. Above all, at least one selected from phosphoric acid, hydrochloric acid, boric acid, sulfuric acid, citric acid, acetic acid and methanesulfonic acid is preferred.

Examples of the basic catalyst include ammonia water; an organic base such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane and imidazole; an organic salt hydroxide such as tetramethylammonium hydroxide and tetraethylammonium hydroxide; a metal alkoxide such as sodium methoxide, sodium ethoxide, sodium t-butoxide and potassium t-butoxide; a metal hydride such as sodium hydride and calcium hydride; a metal hydroxide such as sodium hydroxide, potassium hydroxide and calcium hydroxide; a metal carbonate such as sodium carbonate, potassium carbonate and magnesium carbonate; a metal hydrogencarbonate such as sodium hydrogencarbonate and potassium hydrogencarbonate; and the like.

The polycondensation catalyst is normally used in an amount within a range of 0.05 to 10 mol %, preferably 0.1 to 5 mol % based on the total molar amount of the silane compound.

When a solvent is used, the solvent for use can be appropriately selected depending on the type or the like of the silane compound. Examples of the solvent include water; aromatic hydrocarbons such as benzene, toluene and xylene; esters such as methyl acetate, ethyl acetate, propyl acetate, butyl acetate and methyl propionate; ketones such as acetone, methylethylketone, methylisobutylketone and cyclohexanone; alcohols such as methyl alcohol, ethyl alcohol, n-propyl alcohol, isopropyl alcohol, n-butyl alcohol, isobutyl alcohol, s-butyl alcohol and t-butyl alcohol; and the like. These solvents may be used either alone or in combination of two or more kinds.

In addition, when adopting the method (c), polycondensation reaction in an aqueous system in the presence of an acid catalyst may be conducted followed by further polycondensation under a basic condition by adding an organic solvent and an excess amount of basic catalyst (such as ammonia water) to the reaction solution.

The solvent is used in an amount of 0.1 to 10 liters, preferably 0.1 to 2 liters per 1 mol of the total molar amount of the silane compound.

The temperature for polycondensing the silane compound is normally within a range of 0° C. to a boiling point of the solvent for use, preferably 20 to 100° C. If the reaction temperature is too low, progress of the polycondensation reaction may be insufficient. On the other hand, if the reaction temperature is too high, it may be difficult to suppress gelation. The reaction is normally completed in 30 minutes to 20 hours.

After completion of the reaction, neutralization may be carried out by adding an alkali aqueous solution such as sodium hydrogencarbonate to the reaction solution when using an acid catalyst, or by adding an acid such as hydrochloric acid to the reaction solution when using a base catalyst, to remove the resulting salt by filtration, washing with water, or the like to obtain the desired silane compound polymer (A).

When the silane compound polymer (A) is produced by the above method, a part without dealcoholization or the like at $OR^3$ or $X^1$ in the silane compound (1) remains in the silane compound polymer (A). Thereby, the silane compound polymer (A) may contain the repeating units represented by the formulas (a-6) and (a-7) besides the repeating unit represented by the formula (a-5).

Component (B)

The component (B) constituting the curable composition according to one embodiment of the invention is a silane coupling agent having a nitrogen atom in its molecule (hereinafter referred to as "silane coupling agent (B)" in some cases).

The curable composition containing the component (B) provides a cured product more excellent in adhesiveness and heat resistance.

Examples of the silane coupling agent (B) include a trialkoxysilane compound represented by the following formula (b-1), a dialkoxyalkylsilane compound or dialkoxyarylsilane compound represented by the following formula (b-2), and the like.

$(R^a)_3SiR^c$ (b-1)

$(R^a)_2(R^b)SiR^c$ (b-2)

In the above formula, $R^a$ represents an alkoxy group having 1 to 6 carbon atoms such as a methoxy group, an ethoxy group, an n-propoxy group, an isopropoxy group, an n-butoxy group and a t-butoxy group. Each of the plural $R^a$ groups may be the same or different from each other.

$R^b$ represents an alkyl group having 1 to 6 carbon atoms such as a methyl group, an ethyl group, an n-propyl group, an isopropyl group, an n-butyl group and a t-butyl group; or an aryl group with or without substituents, such as a phenyl group, a 4-chlorophenyl group, a 4-methylphenyl group and a 1-naphthyl group.

$R^c$ represents an organic group having a nitrogen atom and 1 to 30 carbon atoms. Furthermore, $R^c$ may bind to another group containing a silicon atom.

Specific examples of the organic group represented by $R^c$ and having 1 to 10 carbon atoms include an N-2-(aminoethyl)-3-aminopropyl group, a 3-aminopropyl group, an N-(1,3-dimethyl-butylidene) aminopropyl group, a 3-ureidopropyl group, an N-phenyl-aminopropyl group and the like.

Among the compounds represented by the formula (b-1) or (b-2), when $R^c$ is an organic group bound to another group containing a silicon atom, the compounds include a compound which binds to another silicon atom through an isocyanurate skeleton to constitute an isocyanurate-based silane coupling agent, and a compound which binds to another silicon atom through an urea skeleton to constitute an urea-based silane coupling agent.

Above all, as the silane coupling agent (B), the isocyanurate-based silane coupling agent, and the urea-based silane coupling agent are preferred, and a compound having 4 or more alkoxy groups bound to a silicon atom in its molecule is more preferred, because a cured product having a higher adhesive strength can be easily obtained.

Having 4 or more alkoxy groups bound to a silicon atom means that the total number of alkoxy groups bound to the same silicon atom and alkoxy groups bound to different silicon atoms is 4 or more.

The isocyanurate-based silane coupling agent having 4 or more alkoxy groups bound to a silicon atom is exemplified by a compound represented by the following formula (b-3), and the urea-based silane coupling agent having 4 or more alkoxy groups bound to a silicon atom is exemplified by a compound represented by the following formula (b-4).

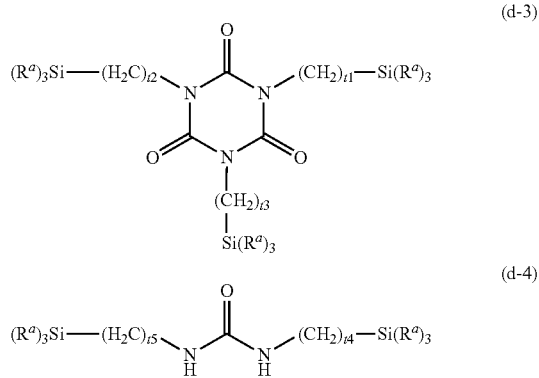

In the formula, $R^a$ represents the same as described above.

Each of t1 to t5 independently represents an integer of 1 to 10, preferably 1 to 6, and particularly preferably 3.

Specific examples of the compound represented by the formula (b-3) include 1,3,5-N-tris[(tri(1-6C)alkoxy)silyl (1-10C)alkyl] isocyanurate such as 1,3,5-N-tris(3-trimethoxysilylpropyl) isocyanurate, 1,3,5,-N-tris(3-triethoxysilylpropyl) isocyanurate, 1,3,5,-N-tris(3-triisopropoxysilylpropyl) isocyanurate, 1,3,5,-N-tris(3-tributoxysilylpropyl) isocyanurate; 1,3,5-N-tris[(di(1-6C)alkoxy)silyl (1-10C)alkyl]isocyanurate such as 1,3,5,-N-tris(3-dimethoxymethylsilylpropyl) isocyanurate, 1,3,5,-N-tris(3-dimethoxyethylsilylpropyl) isocyanurate, 1,3,5,-N-tris(3-dimethoxyisopropylsilylpropyl) isocyanurate, 1,3,5,-N-tris(3-dimethoxy-n-propylsilylpropyl) isocyanurate, 1,3,5,-N-tris(3-dimethoxyphenylsilylpropyl) isocyanurate, 1,3,5,-N-tris(3-diethoxymethylsilylpropyl) isocyanurate, 1,3,5,-N-tris(3-diethoxyethylsilylpropyl) isocyanurate, 1,3,5,-N-tris(3-diethoxyisopropylsilylpropyl) isocyanurate, 1,3,5,-N-tris(3-diethoxy-n-propylsilylpropyl) isocyanurate, 1,3,5,-N-tris(3-diethoxyphenylsilylpropyl) isocyanurate, 1,3,5,-N-tris(3-diisopropoxymethylsilylpropyl) isocyanurate, 1,3,5,-N-tris(3-diisopropoxyethylsilylpropyl) isocyanurate, 1,3,5,-N-tris(3-diisopropoxyisopropylsilylpropyl) isocyanurate, 1,3,5,-N-tris(3-diisopropoxy-n-propylsilylpropyl) isocyanurate, 1,3,5,-N-tris(3-diisopropoxyphenylsilylpropyl) isocyanurate, 1,3,5,-N-tris(3-dibutoxymethylsilylpropyl) isocyanurate, 1,3,5,-N-tris(3-dibutoxyethylsilylpropyl) isocyanurate, 1,3,5,-N-tris(3-dibutoxyisopropylsilylpropyl) isocyanurate, 1,3,5,-N-tris(3-dibutoxy-n-propylsilylpropyl) isocyanurate and 1,3,5,-N-tris(3-dibutoxyphenylsilylpropyl) isocyanurate; and the like.

Specific examples of the compound represented by the formula (b-4) include N, N'-bis[(tri(1-6C)alkoxysilyl) (1-10C)alkyl] urea such as N,N'-bis(3-trimethoxysilylpropyl) urea, N,N'-bis(3-triethoxysilylpropyl) urea, N,N'-bis(3-tripropoxysilylpropyl) urea, N,N'-bis(3-tributoxysilylpropyl) urea and N,N'-bis(2-trimethoxysilylethyl) urea;

N,N'-bis[(di(1-6C)alkoxy (1-6C)alkylsilyl (1-10C)alkyl) urea such as N,N'-bis(3-dimethoxymethylsilylpropyl) urea, N,N'-bis(3-dimethoxyethylsilylpropyl) urea and N,N'-bis(3-diethoxymethylsilylpropyl) urea;

N,N'-bis[(di(1-6C)alkoxy (6-20C)arylsilyl (1-10C)alkyl) urea such as N,N'-bis(3-dimethoxyphenylsilylpropyl) urea and N,N'-bis(3-diethoxyphenylsilylpropyl) urea; and the like.

The silane coupling agent (B) may be used either alone or in combination of two or more kinds.

Above all, as the silane coupling agent (B), 1,3,5-N-tris (3-trimethoxysilylpropyl) isocyanurate, 1,3,5-N-tris(3-triethoxysilylpropyl) isocyanurate (hereinafter referred to as "isocyanurate compound"), N,N'-bis(3-trimethoxysilylpropyl) urea, N,N'-bis(3-triethoxysilylpropyl) urea (hereinafter referred to as "urea compound") and a combination of the isocyanurate compound and the urea compound are preferably used.

When the isocyanurate compound and the urea compound are used in combination, they are used, in a mass ratio (isocyanurate compound) and (urea compound) of preferably 100:1 to 100:200, and more preferably 100:10 to 100:110. When the isocyanurate compound and the urea compound are used in combination in such a ratio, a curable composition providing a cured product more excellent in heat resistance and adhesiveness can be obtained.

In the curable composition according to one embodiment of the invention, the content of the component (B) is not particularly limited, but the mass ratio between the component (A) and the component (B) [component (A):component (B)] is preferably 100:0.1 to 100:50, more preferably 100:0.3 to 100:40, more preferably 100:1 to 100:30, and even more preferably 100:3 to 100:25.

The cured product of the curable composition containing the component (A) and the component (B) in such a ratio is more excellent in heat resistance and adhesiveness.

Component (C)

The curable composition according to one embodiment of the invention may contain, as the component (C), a silane coupling agent other than the component (B).

The cured product of the curable composition containing the component (C) is more excellent in adhesiveness.

As the silane coupling agent other than the component (B), a silane coupling agent having an acid anhydride structure in its molecule (hereinafter referred to as "silane coupling agent (C)" in some cases) is preferred.

Examples of the silane coupling agent (C) include tri(1-6C)alkoxysilyl (2-8C)alkylsuccinic anhydride such as 2-(trimethoxysilyl)ethylsuccinic anhydride, 2-(triethoxysilyl)ethylsuccinic anhydride, 3-(trimethoxysilyl)propylsuccinic anhydride and 3-(triethoxysilyl)propylsuccinic anhydride;

di(1-6C)alkoxymethylsilyl (2-8C)alkylsuccinic anhydride such as 2-(dimethoxymethylsilyl)ethylsuccinic anhydride;

(1-6C)alkoxydimethylsilyl (2-8C)alkylsuccinic anhydride such as 2-(methoxydimethylsilyl)ethylsuccinic anhydride;

trihalogenosilyl (2-8C)alkylsuccinic anhydride such as 2-(trichlorosilyl)ethylsuccinic anhydride and 2-(tribromosilyl)ethylsuccinic anhydride;

dihalogenomethylsilyl (2-8C)alkylsuccinic anhydride such as 2-(dichloromethylsilyl)ethylsuccinic anhydride;

halogenodimethylsilyl (2-8C)alkylsuccinic anhydride such as 2-(chlorodimethylsilyl) ethylsuccinic anhydride; and the like.

The silane coupling agent (C) may be used either alone or in combination of two or more kinds.

Above all, as the silane coupling agent (C), tri(1-6C) alkoxysilyl (2-8C)alkylsuccinic anhydride is preferred, and 3-(trimethoxysilyl)propylsuccinic anhydride or 3-(triethoxysilyl)propylsuccinic anhydride is particularly preferred.

When the curable composition according to one embodiment of the invention contains the component (C), the content of the component (C) is not particularly limited, but the mass ratio between the component (A) and the component (C) [component (A):component (C)] is preferably 100:0.1 to 100:30, more preferably 100:0.3 to 100:20, more preferably 100:0.5 to 100:15, and even more preferably 100:1 to 100:10.

The cured product of the curable composition containing the component (C) in such a ratio is more excellent in adhesiveness.

Other Components

The curable composition according to one embodiment of the invention may further contain other components in the above components unless the object of the present invention is impaired.

Examples of other components include an antioxidant, a UV absorber, a light stabilizer and the like.

The antioxidant is added to prevent oxidative degradation during heating. Examples of the antioxidant include a phosphorus-based antioxidant, a phenol-based antioxidant, a sulfur-based antioxidant, and the like.

Examples of the phosphorus-based antioxidant include phosphites, oxaphosphaphenanthrene oxides and the like. Examples of the phenol-based antioxidant include monophenols, bisphenols, polymeric phenols and the like. Examples of the sulfur-based antioxidant include dilauryl-3,3'-thiodipropionate, dimyristyl-3,3'-thiodipropionate, distearyl-3,3'-thiodipropionate and the like.

These antioxidants may be used either alone or in combination of two or more kinds.

The antioxidant is normally used in an amount of 10 mass % or less based on the component (A).

The UV absorber is added for the purpose of improving a light resistance of the obtained cured product.

Examples of the UV absorber include salicylic acids, benzophenones, benzotriazoles, hindered amines and the like.

The UV absorber may be used either alone or in combination of two or more kinds.

The UV absorber is normally used in an amount of 10 mass % or less based on the component (A).

The light stabilizer is added for the purpose of improving the light resistance of the obtained cured product.

Examples of the light stabilizer include e.g. hindered amines such as poly[{6-(1,1,3,3,-tetramethylbutyl)amino-1,3,5-triazin-2,4-diyl}{(2,2,6,6-tetramethyl-4-piperidine)imino}hexamethylene {(2,2,6,6-tetramethyl-4-piperidine)imino}].

These light stabilizers may be used either alone or in combination of two or more kinds.

The light stabilizer is normally used in an amount of 10 mass % or less based on the component (A).

These components are normally used in a total amount of 20 mass % or less based on the component (A).

The curable composition according to one embodiment of the invention may contain a diluent.

The diluent is used for the purpose of providing fluidity to the curable composition according to one embodiment of the invention.

Examples of the diluent include e.g. acetates such as diethyleneglycol monobutylether acetate and 1,6-hexanediol diacetate; diglycidyl ethers such as tipropyleneglycol-n-butylether, glycerin diglycidyl ether, butanediol diglycidyl ether, diglycidyl aniline, neopentylglycol glycidyl ether, cyclohexanedimethanol diglycidyl ether, alkylene diglycidyl ether, polyglycol diglycidyl ether and polypropylene glycol diglycidyl ether; triglycidyl ethers such as trimethylolpropane triglycidyl ether and glycerin triglycidyl ether; and vinylhexene oxides such as 4-vinylcyclohexene monooxide, vinylcyclohexene dioxide and methylated vinylcyclohexene dioxide.

These diluents may be used either alone or in combination of two or more kinds.

The diluent is used in the solid content of the curable composition according to one embodiment of the invention of preferably 50 to 100 mass %, more preferably 60 to 90 mass %, and even more preferably 70 to 85 mass %.

In addition, in the curable composition according to one embodiment of the invention, the total amount of the component (A) and the component (B) is preferably 50 to 100 mass %, and more preferably 60 to 100 mass % based on the whole components excluding the diluent in the curable composition. When the total amount of the component (A) and the component (B) is within the above range, the cured product of the curable composition according to one embodiment of the invention is more excellent in heat resistance and adhesiveness.

The curable composition according to one embodiment of the invention can be produced e.g. by using a method having the following step (I) and step (II).

Step (I): the step of polycondensing a compound represented by the following formula (a-3), or compounds represented by the following formulas (a-3) and (a-4) in the presence of a polycondensation catalyst to obtain a curable polysilsesquioxane compound:

(a-3)

(a-4)

(wherein $R^1$, $R^2$ and D represent the same as described above. Each of $R^3$ and $R^4$ independently represents an alkyl group having 1 to 10 carbon atoms, each of $X^1$ and $X^2$ independently represents a halogen atom, each of p and q independently represents an integer of 0 to 3. Each of the plural $R^3$, $R^4$, $X^1$ and $X^2$ may be the same or different from each other.)

Step (II): the step of mixing the curable polysilsesquioxane compound obtained in the step (I) with the component (B)

The step (I) is similar to that previously described for the synthesis method of the silane compound polymer (A).

The step (II) is not particularly limited. It can be prepared e.g. by mixing the curable polysilsesquioxane compound obtained in the step (I) with the component (B), and optionally other components at a predetermined ratio, and defoaming it.

The mixing method and the defoaming method are not particularly limited, and known methods can be used.

As described above, the curable composition according to one embodiment of the invention contains the component (A) and the component (B) as essential components.

When such a curable composition according to one embodiment of the invention is used, a cured product excellent in adhesiveness and heat resistance and having a low refractive index can be obtained.

Hence, the curable composition according to one embodiment of the invention is suitably used as a raw material for optical components and formed articles, an adhesive, a coating agent or the like. In particular, the curable composition according to one embodiment of the invention can be suitably used as a composition for fixing an optical element, because the problem related to the deterioration of the optical element-fixing material accompanying the enhanced luminance of the optical element can be solved.

2) Cured Product

The cured product according to one embodiment of the invention is obtained by curing the curable composition according to one embodiment of the invention.

The method for curing the curable composition according to one embodiment of the invention is exemplified by thermal curing. The heating temperature in curing is normally 100 to 200° C., and the heating time is normally 10 minutes to 20 hours, and preferably 30 minutes to 10 hours.

The cured product according to one embodiment of the invention is excellent in adhesiveness and heat resistance and has a low refractive index.

Thus, the cured product according to one embodiment of the invention can be suitably used as an optical element-fixing material capable to solve the problem related to deterioration accompanying the enhanced luminance of the optical element.

The excellent adhesiveness and heat resistance of the cured product according to one embodiment of the invention can be confirmed e.g. in the following manner. That is, the curable composition according to one embodiment of the invention is applied on a mirror surface of a silicon chip, the coated surface is placed on the adherend, press-bonded, and heated to cure it. This is left on the measurement stage of a bond tester which has been previously heated to a predetermined temperature (e.g. 23° C., 100° C.) for 30 seconds, stressed in a direction parallel to the adhesive surface (shear direction) from a height of 50 μm above the adherend to measure the adhesive strength between the test piece and the adherend.

The adhesive strength of the cured product according to one embodiment of the invention is preferably 60 N/2 mm square or higher, more preferably 80 N/2 mm square or higher, and particularly preferably 100 N/2 mm square or higher, at 23° C. In addition, the adhesive strength of the cured product is preferably 30 N/2 mm square or higher, more preferably 40 N/2 mm square or higher, even more preferably 50 N/2 mm square or higher, and particularly preferably 60 N/2 mm square or higher, at 100° C.

The refractive index (nD) of the cured product according to one embodiment of the invention is preferably 1.35 or higher, and more preferably 1.36 or higher. In addition, from the viewpoint of obtaining a cured product having a refractive index suitable for the purpose, it is preferably 1.41 or lower, more preferably 1.40 or lower, even more preferably 1.39 or lower, still more preferably 1.38 or lower, and particularly preferably 1.37 or lower.

Since the cured product according to one embodiment of the invention has the above-described properties, it is suitably used as an optical element-fixing material.

3) Method for Using Curable Composition

The method according to one embodiment of the invention is a method for using the curable composition according to one embodiment of the invention as an adhesive or sealant for an optical element-fixing material.

Examples of the optical element include a light emitter such as LED and LD, a light-receiving element, a composite optical element, an optical integrated circuit, and the like.

<Adhesive for Optical Element-Fixing Material>

The curable composition according to one embodiment of the invention can be suitably used as an adhesive for an optical element-fixing material.

The method for using the curable composition according to one embodiment of the invention as an adhesive for an optical element-fixing material is exemplified by a method in which the composition is applied to one or both of adhesive surfaces of materials to be adhered (optical element, substrate thereof, etc.), press-bonded, then thermally cured to firmly adhere the both materials to be adhered to each other. An application amount of the curable composition according to one embodiment of the invention is not particularly limited as long as it is within an amount that allows firm adhesion between the materials to be adhered by curing. Normally the amount allows the coating film of the curable composition to have a thickness of 0.5 to 5 μm, and preferably 1 to 3 μm.

Examples of the substrate material for bonding the optical element include glasses such as soda-lime glass and heat-resistant hard glass; ceramics; sapphire; metals such as iron, copper, aluminum, gold, silver, platinum, chromium, titanium and alloys of these metals, and stainless steel (SUS302, SUS304, SUS304L, SUS309, etc.); synthetic resins such as polyethylene terephthalate, polybutylene terephthalate, polyethylene naphthalate, ethylene-vinyl acetate copolymer, polystyrene, polycarbonate, polymethylpentene, polysulfone, polyetheretherketone, polyethersulfone, polyphenylene sulfide, polyether imide, polyimide, polyamide, acrylic resin, norbornene-based resin, cycloolefin resin and glass epoxy resin; and the like.

The heating temperature during thermal curing depends on the curable composition and the like for use, but is normally 100 to 200° C. The heating time is normally 10 minutes to 20 hours, and preferably 30 minutes to 10 hours.

<Sealant for Optical Element-Fixing Material>

The curable composition according to one embodiment of the invention can be suitably used as a sealant for an optical element-fixing material.

The method for using the curable composition according to one embodiment of the invention as a sealant for an optical element-fixing material is exemplified by a method in which the composition is formed into a desired shape to obtain a formed article involving an optical element, and then the article is thermally cured to produce an optical element sealant, and the like.

The method for forming the curable composition according to one embodiment of the invention into a desired shape is not particularly limited, and a normal transfer forming method and a known mold method such as a casting method may be adopted.

The heating temperature during thermal curing depends on the curable composition and the like for use, but is normally 100 to 200° C. The heating time is normally 10 minutes to 20 hours, and preferably 30 minutes to 10 hours.

Since the obtained optical element sealant uses the curable composition according to one embodiment of the invention, it is excellent in heat resistance and has a high adhesive strength.

4) Optical Device

The optical device according to one embodiment of the invention is obtained by using the curable composition according to one embodiment of the invention as an adhesive or sealant for an optical element-fixing material.

Examples of the optical element include a light emitter such as LED and LD, a light-receiving element, a composite optical element, an optical integrated circuit, and the like.

The optical device according to one embodiment of the invention is obtained by fixing an optical element using the curable composition according to one embodiment of the invention as an adhesive or sealant for an optical element-fixing material. Consequently, the optical element is fixed with a high adhesive force and is excellent in durability.

EXAMPLES

Next, the present invention will be described in more detail with reference to Examples and Comparative Example, but the present invention is not limited to the following Examples. The units "%" and "parts" respectively refer to "mass %" and "parts by mass" unless otherwise indicated.

(Measurement of Average Molecular Weight)

The mass-average molecular weight (Mw) and the number average molecular weight (Mn) of the silane compound polymer obtained in Production Example were measured as standard polystyrene-equivalent values by the following apparatus under the following conditions.

Apparatus name: HLC-8220 GPC, manufactured by Tosoh Corporation

Column: a column prepared by sequentially connecting TSKgel GMHXL, TSKgel GMHXL and TSKgel 2000HXL Solvent: tetrahydrofuran Injection volume: 80 µl Measurement temperature: 40° C.

Flow rate: 1 ml/min

Detector: differential refractometer

Example 1

5.24 g (24 mmol) of 3,3,3-trifluoropropyltrimethoxysilane (manufactured by AZMAX Corp.) was charged in a 300 ml eggplant flask, to which subsequently an aqueous solution prepared by dissolving 0.04 g of 35% hydrochloric acid (0.25 mol % based on the total amount of the silane compound) in 8.1 ml of distilled water was added while stirring, and the whole content was stirred at 30° C. for 2 hours, then heated to 70° C., stirred for 5 hours, and then cooled to room temperature.

Ethyl acetate was added to the reaction solution, the reaction product was transferred to an organic layer, and then the organic layer was washed with purified water until the pH of the aqueous layer reached 7. Subsequently, the organic layer was concentrated by an evaporator, and the concentrate was vacuum-dried to obtain a silane compound polymer (1). The silane compound polymer (1) had a mass-average molecular weight (Mw) of 1,220 and a molecular weight distribution (Mw/Mn) of 1.03.

To 100 parts of the silane compound polymer (1), 10 parts of tris[3-(trimethoxysilyl)propyl]isocyanurate (manufactured by Shin-Etsu Chemical Co., Ltd.) was added, and 3 parts of 3-(trimethoxysilyl)propylsuccinic anhydride (manufactured by Shin-Etsu Chemical Co., Ltd.) was added, and diethyleneglycol monobutylether acetate was further added so that the viscosity measured under a condition of 25° C. and 200 s$^{-1}$ using an E-type viscometer was 4.5 Pa·s, and the whole content was thoroughly mixed and defoamed to obtain a curable composition (1).

Examples 2 to 10

Silane compound polymers (2) to (10) were obtained in the same manner as in Example 1, except that methyltriethoxysilane (product name "KBE-13" manufactured by Shin-Etsu Chemical Co., Ltd.) and 3,3,3-trifluoropropyltrimethoxysilane were used as silane compounds in amounts shown in Table 1 in Example 1. The mass-average molecular weight (Mw) and molecular weight distribution (Mw/Mn) of each silane compound polymer were as shown in Table 1.

Curable compositions (2) to (10) were obtained in the same manner as in Example 1, except that the silane compound polymers (2) to (10) were used instead of the silane compound polymer (1).

Comparative Example 1

A silane compound polymer (11) was obtained in the same manner as in Example 1, except that 17.83 g (100 mmol) of methyltriethoxysilane was used as the silane compound in Example 1. The silane compound polymer (11) had a mass-average molecular weight (Mw) of 3,270 and a molecular weight distribution (Mw/Mn) of 2.77.

A curable composition (11) was obtained in the same manner as in Example 1, except that the silane compound polymer (11) was used instead of the silane compound polymer (1).

The curable compositions (1) to (11) obtained in Examples and Comparative Example were respectively subjected to the following tests. The results are shown in Table 1.

(Measurement of Adhesive Strength)

The curable composition was each applied on a mirror surface of a silicon chip with a size of 2 mm square so as to have a thickness of about 2 µm, and the applied surface was placed on an adherend (silver-plated copper plate) and press-bonded, which was subsequently cured by heat treatment at 170° C. for 2 hours to obtain an adherend with a test piece. This adherend with the test piece was left for 30 seconds on the measurement stage of a bond tester (Series 4000, manufactured by Dage Japan Co.Ltd.) which had been previously heated to a predetermined temperature (23° C., 100° C.), which was stressed in a direction parallel to the adhesive surface (shear direction) from a height of 50 µm above the adherend at a speed of 200 µm/s to measure the adhesive strength (N/2 mm square) between the test piece and the adherend at 23° C. and 100° C.

(Measurement of Refractive Index)

A die made of polytetrafluoroethylene was placed on a glass treated for release, into which the curable composition was poured, warmed, defoamed, and then cured by heating at 170° C. for 2 hours to prepare a cured piece having a thickness of 1 mm. One flat side of the cured piece was press-bonded onto a prism of an Abbe's refractometer (DR-A1, manufactured by ATAGO CO., LTD,) under a standard environment, and an interface between the prism and the cured piece was irradiated with a sodium D line (589 nm) to measure the refractive index.

TABLE 1

| | Component (A) | | | | | | |
|---|---|---|---|---|---|---|---|
| | Amount of the charged silane compound | | | | | | |
| | 3,3,3-Trifluoro propyltrimethoxysilane | | Methyl triethoxysilane | | Weight-average molecular weight | Molecular weight distribution | Compounding ratio of (A) |
| | (mmol) | (mol %) | (mmol) | (mol %) | (Mw) | (Mw/Mn) | (parts) |
| Example 1 | 24 | 100 | 0 | 0 | 1220 | 1.03 | 100 |
| Example 2 | 45 | 90 | 5 | 10 | 1550 | 1.03 | 100 |
| Example 3 | 40 | 80 | 10 | 20 | 1650 | 1.1 | 100 |
| Example 4 | 15 | 70 | 35 | 30 | 2340 | 1.28 | 100 |
| Example 5 | 30 | 60 | 20 | 40 | 1950 | 1.24 | 100 |
| Example 6 | 25 | 50 | 25 | 50 | 1790 | 1.22 | 100 |
| Example 7 | 20 | 40 | 30 | 60 | 3060 | 1.69 | 100 |
| Example 8 | 15 | 30 | 35 | 70 | 3490 | 1.86 | 100 |
| Example 9 | 10 | 20 | 40 | 80 | 4620 | 2.05 | 100 |
| Example 10 | 5 | 10 | 45 | 90 | 5280 | 2.46 | 100 |
| Comparative Example 1 | 0 | 0 | 100 | 100 | 3270 | 2.77 | 100 |

| | Component (B) Tris[3-(trimethoxysilyl)propyl] isocyanurate Compounding ratio of (B) | Component (C) 3-(Trimethoxysilyl) propylsuccinic anhydride Compounding ratio of (C) | Adhesive strength (N/2 mm square) | | Refractive index |
|---|---|---|---|---|---|
| | (parts) | (parts) | 23° C. | 100° C. | |
| Example 1 | 10 | 3 | 83 | 60 | 1.3678 |
| Example 2 | 10 | 3 | 68 | 32 | 1.3721 |
| Example 3 | 10 | 3 | 72 | 43 | 1.3761 |
| Example 4 | 10 | 3 | 75 | 56 | 1.3800 |
| Example 5 | 10 | 3 | 91 | 41 | 1.3839 |
| Example 6 | 10 | 3 | 73 | 53 | 1.3888 |
| Example 7 | 10 | 3 | 117 | 55 | 1.3928 |
| Example 8 | 10 | 3 | 115 | 85 | 1.3965 |
| Example 9 | 10 | 3 | 157 | 124 | 1.4038 |
| Example 10 | 10 | 3 | 134 | 104 | 1.4083 |
| Comparative Example 1 | 10 | 3 | 154 | 100 | 1.4131 |

The followings can be seen from Table 1.

The cured products obtained by curing the curable compositions (1) to (10) of Examples 1 to 10 are excellent in adhesiveness and heat resistance and have low refractive indexes.

On the other hand, the cured product obtained by curing the curable composition (11) of Comparative Example 1 has a high refractive index.

The invention claimed is:

1. A thermally curable composition comprising the following component (A) and component (B):

Component (A): a curable polysilsesquioxane compound having a repeating unit represented by the following formula (a-1):

$$R^1\text{-D-SiO}_{3/2} \quad (a\text{-}1)$$

wherein $R^1$ represents a fluoroalkyl group represented by a compositional formula: $C_xH_{(2x-y+1)}F_y$, x represents an integer of 1 to 10, and y represents an integer of 2 to $(2x+1)$, D represents a linking group (excluding an alkylene group) for connecting $R^1$ and Si, or a single bond, having a mass-average molecular weight (Mw) of 800 to 20,000, Component (B): a silane coupling agent having a nitrogen atom in its molecule, and the component (B) being a compound represented by the following formula (b-3) or (b-4),

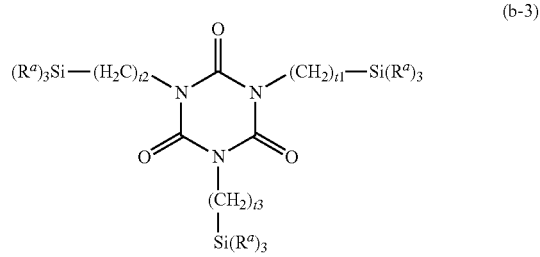

(b-3)

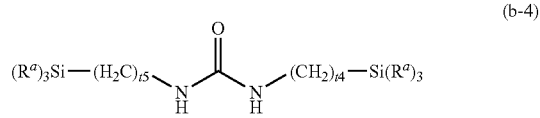

(b-4)

wherein $R^a$ represents an alkoxy group having 1 to 6 carbon atoms, and each of t1 to t5 independently represents an integer of 1 to 10.

2. The thermally curable composition according to claim 1, wherein the curable polysilsesquioxane compound of the component (A) further has a repeating unit represented by the following formula (a-2), $$R^2SiO_{3/2} \quad (a\text{-}2)$$

wherein $R^2$ represents an unsubstituted alkyl group having 1 to 10 carbon atoms, or an aryl group having 6 to 12 carbon atoms with or without substituents.

3. The thermally curable composition according to claim 2, wherein $R^2$ is an unsubstituted alkyl group having 1 to 10 carbon atoms in the repeating unit represented by formula (a-2).

4. The thermally curable composition according to claim 2, wherein the component (A) comprises the repeating unit represented by formula (a-1) and the repeating unit represented by formula (a-2) in a molar ratio [repeating unit represented by formula (a-1)]: [repeating unit represented by formula (a-2)] of 5:95 to 100:0.

5. The thermally curable composition according to claim 1, wherein the component (A) is obtained by polycondensing a compound represented by the following formula (a-3), or compounds represented by the following formulas (a-3) and (a-4) in the presence of a polycondensation catalyst, $$R^1\text{-}D\text{-}Si(OR^3)_p(X^1)_{3-p} \quad (a\text{-}3)$$

$$R^2Si(OR^4)_q(X^2)_{3-q} \quad (a\text{-}4)$$

wherein $R^1$, $R^2$ and D represent the same as described above, each of $R^3$ and $R^4$ independently represents an alkyl group having 1 to 10 carbon atoms, each of $X^1$ and $X^2$ independently represents a halogen atom, each of p and q independently represents an integer of 0 to 3, each of the plural $R^3$, $R^4$, $X^1$ and $X^2$ may be the same or different from each other.

6. The thermally curable composition according to claim 1, which further comprises a diluent.

7. The thermally curable composition according to claim 6, wherein the total amount of the component (A) and the component (B) is 50 to 100 mass % based on the whole components excluding the diluent in the thermally curable composition.

8. The thermally curable composition according to claim 1, wherein the solid content of the curable composition is 50 mass % to less than 100 mass %.

9. A method for producing the curable composition according to claim 1, having the following steps (I) and (II):

Step (I): the step of obtaining the curable polysilsesquioxane compound by polycondensing a compound represented by the following formula (a-3), or compounds represented by the following formulas (a-3) and (a-4) in the presence of the polycondensation catalyst:

$$R^1\text{-}D\text{-}Si(OR^3)_p(X^1)_{3-p} \quad (a\text{-}3)$$

$$R^2Si(OR^4)_q(X^2)_{3-q} \quad (a\text{-}4)$$

wherein $R^1$, $R^2$ and D represent the same groups as described above, each of $R^3$ and $R^4$ independently represents an alkyl group having 1 to 10 carbon atoms, each of $X^1$ and $X^2$ independently represents a halogen atom, each of p and q independently represents an integer of 0 to 3, each of the plural $R^3$, $R^4$, $X^1$ and $X^2$ may be the same or different from each other, Step (II): the step of mixing the curable polysilsesquioxane compound obtained in the step (I) with the component (B).

10. A cured product obtained by thermal curing the thermally curable composition according to claim 1.

11. The cured product according to claim 10 which is an optical element-fixing material.

12. A method for using the thermally curable composition according to claim 1 as an adhesive, said method comprising applying the thermosetting composition to a surface of an optical element or a surface of a substrate, press-bonding the optical element and substrate together, and thermal curing to adhere said optical element with said substrate.

13. A method for using the thermally curable composition according to claim 1 as a sealant, said method comprising molding the thermosetting composition with an optical element to make a formed article, and thermal curing the formed article to make an optical element sealant.

14. An optical device obtained by using the thermally curable composition according to claim 1 as an adhesive or a sealant for an optical element-fixing material.

* * * * *